United States Patent
Chiu et al.

(10) Patent No.: US 12,469,789 B2
(45) Date of Patent: Nov. 11, 2025

(54) SEMICONDUCTOR STRUCTURE

(71) Applicant: TAIWAN SEMICONDUCTOR MANUFACTURING COMPANY LTD., Hsinchu (TW)

(72) Inventors: U-Ting Chiu, Hsinchu (TW); Yu-Shih Wang, Tainan (TW); Chun-Cheng Chou, Taichung (TW); Yu-Fang Huang, Hsinchu (TW); Chun-Neng Lin, Hsin-Chu (TW); Ming-Hsi Yeh, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 81 days.

(21) Appl. No.: 18/169,868

(22) Filed: Feb. 15, 2023

(65) Prior Publication Data
US 2023/0197617 A1    Jun. 22, 2023

Related U.S. Application Data

(62) Division of application No. 16/990,940, filed on Aug. 11, 2020, now Pat. No. 11,587,875.

(51) Int. Cl.
*H01L 23/528*    (2006.01)
*H01L 21/311*    (2006.01)
(Continued)

(52) U.S. Cl.
CPC ...... *H01L 23/535* (2013.01); *H01L 21/31116* (2013.01); *H01L 21/32134* (2013.01);
(Continued)

(58) Field of Classification Search
CPC ............. H01L 23/535; H01L 21/31116; H01L 21/32134; H01L 21/76805;
(Continued)

(56) References Cited

U.S. PATENT DOCUMENTS

2003/0194872 A1*  10/2003  Parikh ............... H01L 21/76868
                                                              257/E21.585
2017/0278747 A1*   9/2017  Adusumilli ....... H01L 21/76897
(Continued)

*Primary Examiner* — Julio J Maldonado
*Assistant Examiner* — Paul A Berry
(74) *Attorney, Agent, or Firm* — WPAT LAW; Anthony King

(57) ABSTRACT

A connecting structure includes a substrate, a first conductive feature, a second conductive feature, a third conductive feature over the first conductive feature, and a fourth conductive feature over the second conductive feature. The substrate includes a first region and a second region. The first conductive feature is disposed in the first region and has a first width. The second conductive feature is disposed in the second region and has a second width greater than the first width of the first conductive feature. The third conductive feature includes a first anchor portion surrounded by the first conductive feature. The fourth conductive feature includes a second anchor portion surrounded by the second conductive feature. A depth difference ratio between a depth of the first anchor portion and a depth of the second anchor portion is less than approximately 10%.

20 Claims, 11 Drawing Sheets

(51) Int. Cl.
*H01L 21/3213* (2006.01)
*H01L 21/768* (2006.01)
*H01L 23/535* (2006.01)
*H10B 10/00* (2023.01)

(52) U.S. Cl.
CPC .. *H01L 21/76805* (2013.01); *H01L 21/76892* (2013.01); *H01L 21/76895* (2013.01); *H01L 23/5283* (2013.01); *H10B 10/12* (2023.02); *H10B 10/18* (2023.02)

(58) Field of Classification Search
CPC ......... H01L 21/76892; H01L 21/76895; H01L 23/5283; H01L 21/823475; H01L 2924/1434; H01L 2924/1437; H01L 23/528; H01L 21/76816; H01L 21/76843; H10B 10/12; H10B 10/00–18; H10B 12/00; H10B 20/00; H10B 12/056; H10B 12/36; H10B 20/30; H10D 62/149–161; H10D 62/021; H10D 30/0277; H10D 84/013–0133; H10D 84/017; H10D 84/834; H10D 84/83–859; H10D 84/401–409; H10D 84/811–817; H10D 84/403–409

See application file for complete search history.

(56) References Cited

U.S. PATENT DOCUMENTS

| | | | |
|---|---|---|---|
| 2018/0068889 A1* | 3/2018 | Choi | H01L 21/76805 |
| 2019/0067131 A1* | 2/2019 | Liaw | H10D 30/6219 |
| 2019/0088542 A1* | 3/2019 | Hsieh | H10D 30/6219 |
| 2020/0006131 A1* | 1/2020 | Shimabukuro | H01L 21/76814 |

* cited by examiner

SEMICONDUCTOR STRUCTURE

PRIORITY CLAIM AND CROSS-REFERENCE

This application is a divisional application of U.S. patent application Ser. No. 16/990,940 filed on Aug. 11, 2020, entitled of "CONNECTING STRUCTURE AND METHOD FOR FORMING THE SAME", which is incorporated by reference in its entirety.

BACKGROUND

The semiconductor integrated circuit (IC) industry has experienced rapid growth. Technological advances in IC materials and design have produced continuous improvements in generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs.

However, as the feature sizes continue to decrease, fabrication processes continue to become more difficult to perform. Thus, there is a challenge to form reliable semiconductor devices with smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 4A to 4G are schematic drawings illustrating various stages in a method for forming a connecting structure according to aspects of one or more embodiments of the present disclosure, wherein.

FIG. 4D is a partial enlarged view of FIG. 4C, and FIG. 4G is a partial enlarged view of FIG. 4F.

DETAILED DESCRIPTION

Figure 1:
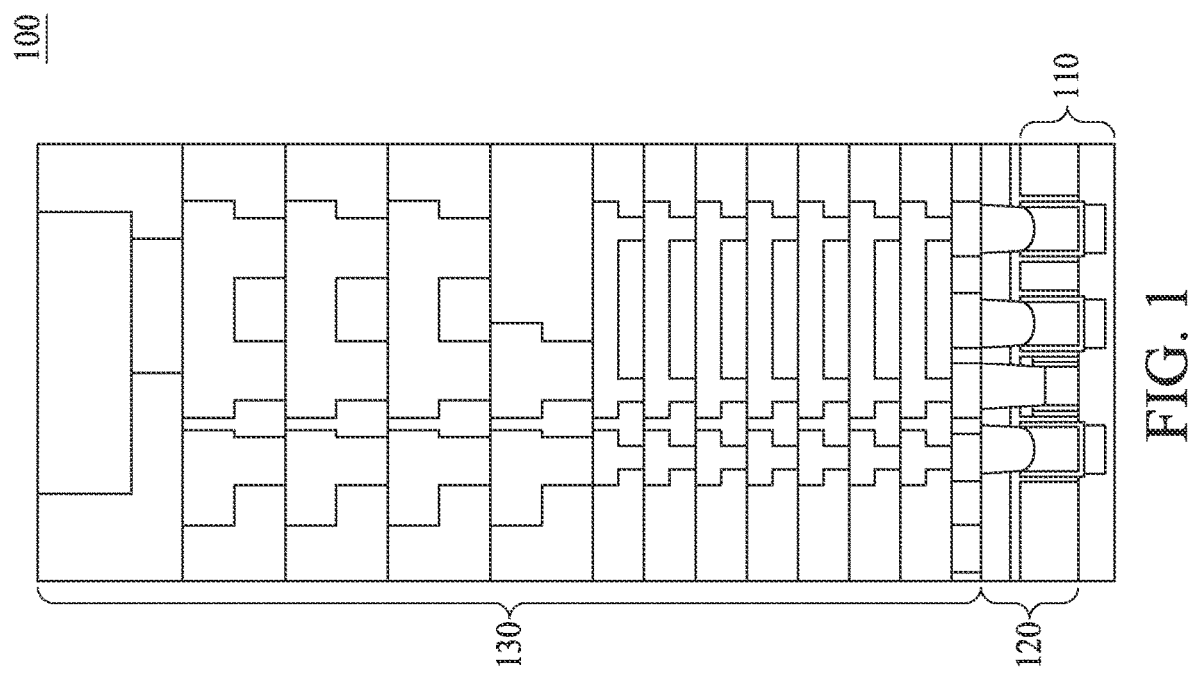
FIG. 1 is a fragmentary cross-sectional view of a semiconductor structure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 100 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

FIG. 1 is a fragmentary cross-sectional view of a semiconductor structure 100. In some embodiments, an IC manufacturing process flow can typically be divided into three categories: front-end-of-line (FEOL), middle-end-of-line (MEOL) and back-end-of-line (BEOL). FEOL generally encompasses processes related to fabrication of IC devices, such as transistors. For example, FEOL processes can include formation of isolation structures for isolating IC devices, gate structures, and source and drain structures (also referred to as source/drain structures) that form a transistor. In some embodiments, the devices formed by the FEOL processes can be referred to as FEOL devices 110. MEOL generally encompasses processes related to fabrication of connecting structures (also referred to as contacts or plugs) that connect to conductive features (or conductive regions) of the IC devices. For example, MEOL processes can include formation of connecting structures that connect to the gate structures and connecting structures that connect to the source/drain structures. In some embodiments, the connecting structures formed by the MEOL processes can be referred to as MEOL structures 120. BEOL generally encompasses processes related to fabrication of multilayer interconnect (MLI) structures that electrically connect the IC devices to the connecting structures fabricated by FEOL and MEOL. In some embodiments, the MLI structures formed by the BEOL processes can be referred to as BEOL structures 130. Accordingly, a semiconductor structure 100 can be constructed by the FEOL devices 110, the MEOL structures 120 and the BEOL structures 130, and operation of the IC devices can be enabled.

As mentioned above, the FEOL devices 110 are formed in the FEOL process. In some comparative approaches in the FEOL process, a semiconductor substrate may be received. The semiconductor substrate may include regions for accommodating different FEOL devices. For example, the semiconductor substrate may include a region for accommodating memory devices, a region for accommodating high-voltage (HV) devices, a region for accommodating input/output (IO) deices, and a region for accommodating logic (core) devices. Different devices may have different dimension requirements not only in the FEOL process but also in the MEOL process. Further, the dimension requirements for FEOL devices 110 in different regions or MEOL structures 120 in different regions of one semiconductor substrate cause difficulty in both the FEOL and the MEOL processes. In some embodiments, different dimension further cause a uniformity issues due to loading effect.

The present disclosure therefore provides connecting structures and a method for forming the connecting structures that is able to mitigate the uniformity issues.

Figure 2:
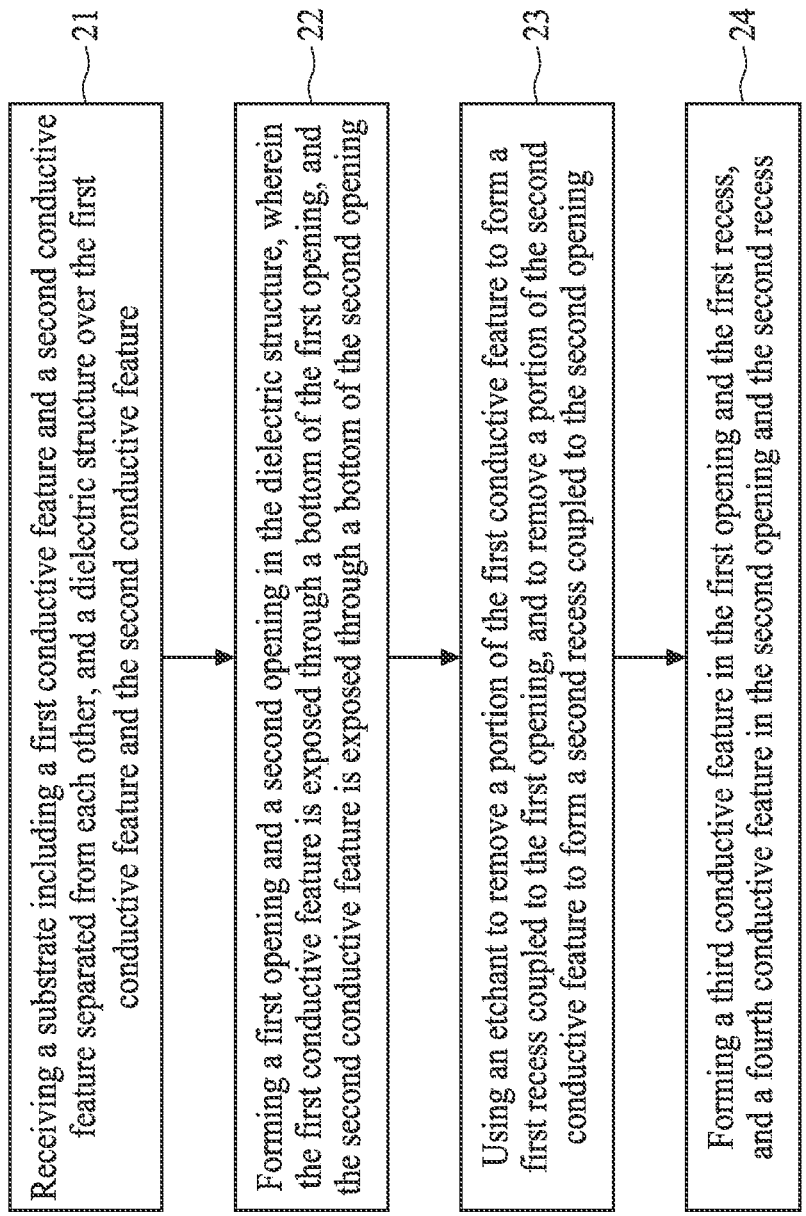
FIG. 2 is a flowchart of a method for forming a connecting structure according to various aspects of the present disclosure.

FIG. 2 is a flowchart representing a method for forming a connecting structure according to aspects of the present disclosure. In some embodiments, the method for forming the connecting structure 20 can be used in a method for forming a connecting structure such as the MEOL interconnect structure mentioned above.

Figure 3:
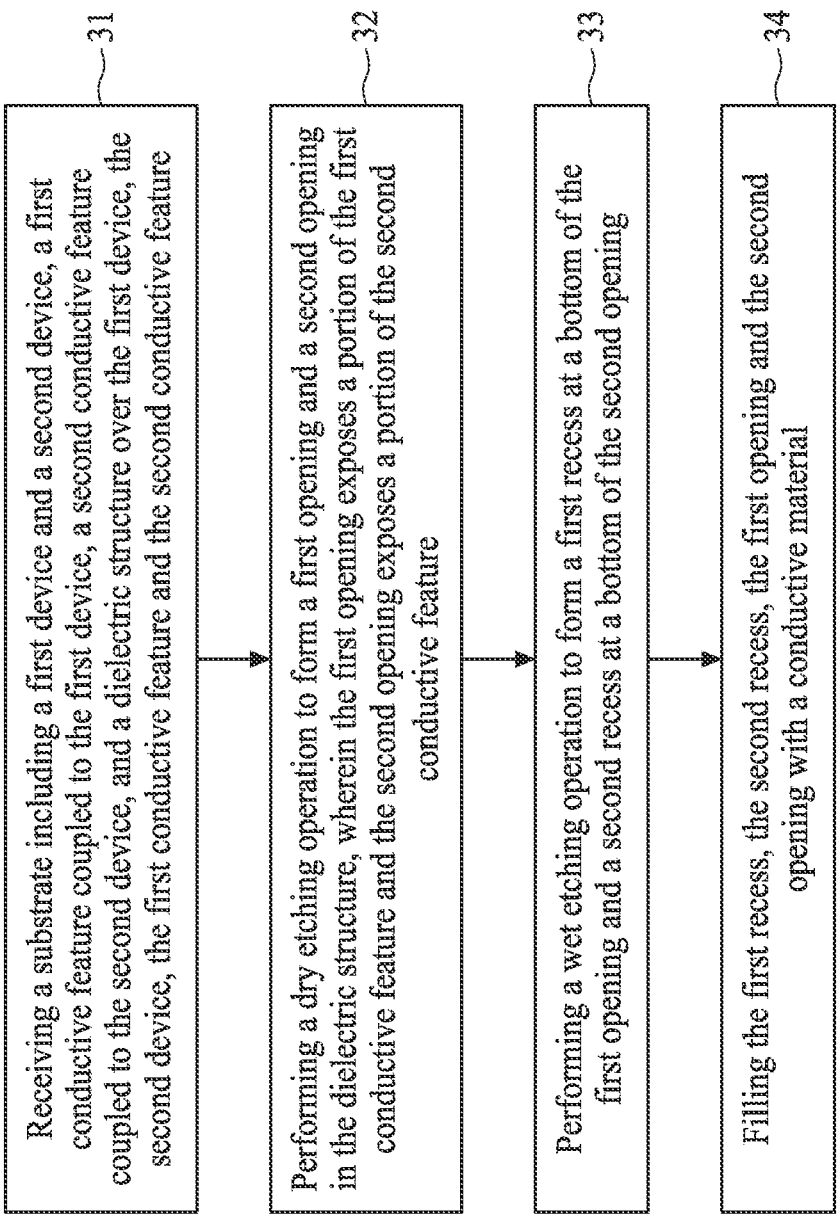
FIG. 3 is a flowchart of a method for forming a connecting structure according to various aspects of the present disclosure.

FIG. 3 is a flowchart representing a method for forming a connecting structure 30 according to aspects of the present disclosure. In some embodiments, the method for forming the connecting structure 30 can be provided to form a connecting structure such as the MEOL interconnect structure mentioned above.

In some embodiments, the method for forming the connecting structure 20 includes a number of operations (21, 22, 23 and 24), and the method for forming the connecting structure 30 includes a number of operations (31, 32, 33 and 34). The method for forming the connecting structure 20 and the method for forming the connecting structure 30 will be further described according to one or more embodiments. It should be noted that the operations of the method for forming the connecting structure 20 and the method for forming the connecting structure 30 may be rearranged or otherwise modified within the scope of the various aspects. It should further be noted that additional processes may be provided before, during, and after the methods 20 and 30, and that some other processes may be only briefly described herein.

FIGS. 4A to 4G are schematic drawings illustrating various stages in a method for forming a connecting structure according to aspects of one or more embodiments of the present disclosure. In some embodiments, FIGS. 4A to 4G are fragmentary cross-sectional views of a semiconductor structure 400, in portion or entirety, according to various aspects of the present disclosure. In operation 21 or operation 31, a substrate 402 is received. In some embodiments, the substrate 402 includes silicon. Alternatively or additionally, the substrate 402 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or a combination thereof. In some implementations, the substrate 402 includes one or more group materials, one or more group II-IV materials, or a combination thereof. In some implementations, the substrate 402 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. The substrate 402 can include various doped regions (not shown) configured according to design requirements of a device, such as p-type doped regions, n-type doped regions, or combinations thereof. P-type doped regions (for example, p-type wells) include p-type dopants, such as boron, indium, another p-type dopant, or a combination thereof. N-type doped regions (for example, n-type wells) include n-type dopants, such as phosphorus, arsenic, another n-type dopant, or a combination thereof. In some implementations, the substrate 402 includes doped regions formed with a combination of p-type dopants and n-type dopants. The various doped regions can be formed directly on and/or in the substrate 402, for example, providing a p-well structure, an n-well structure, a dual-well structure, a raised structure, or a combination thereof. An ion implantation process, a diffusion process, and/or another suitable doping process can be performed to form the various doped regions.

Isolations (not shown) can be formed over and/or in the substrate 402 to electrically isolate various regions, such as various device regions, of the semiconductor structure 400. For example, the isolations can define and electrically isolate active device regions and/or passive device regions from each other. The isolations can include silicon oxide, silicon nitride, silicon oxynitride, another suitable isolation material, or combinations thereof. Isolation features can include different structures, such as shallow trench isolation (STI) structures, deep trench isolation (DTI) structures, and/or local oxidation of silicon (LOCOS) structures. For example but not limited thereto, the substrate 402 can include a first region 404 and a second region 406 that are defined and electrically isolated from other functional regions by the STIs. In some embodiments, the first region 404 can be a memory array region and the second region 406 can be a peripheral region or a logic region. In some embodiments, the memory array region 404 can be a region for accommodating a plurality of static random access memory (SRAM) cells, but the disclosure is not limited thereto. In some embodiments, the second region 406 can be the logic region that includes circuitry for processing information received from memory cells and for controlling reading and writing functions of the memory structures. In other embodiments, the second region 406 can be the peripheral region that includes IO devices.

Figure 4A:
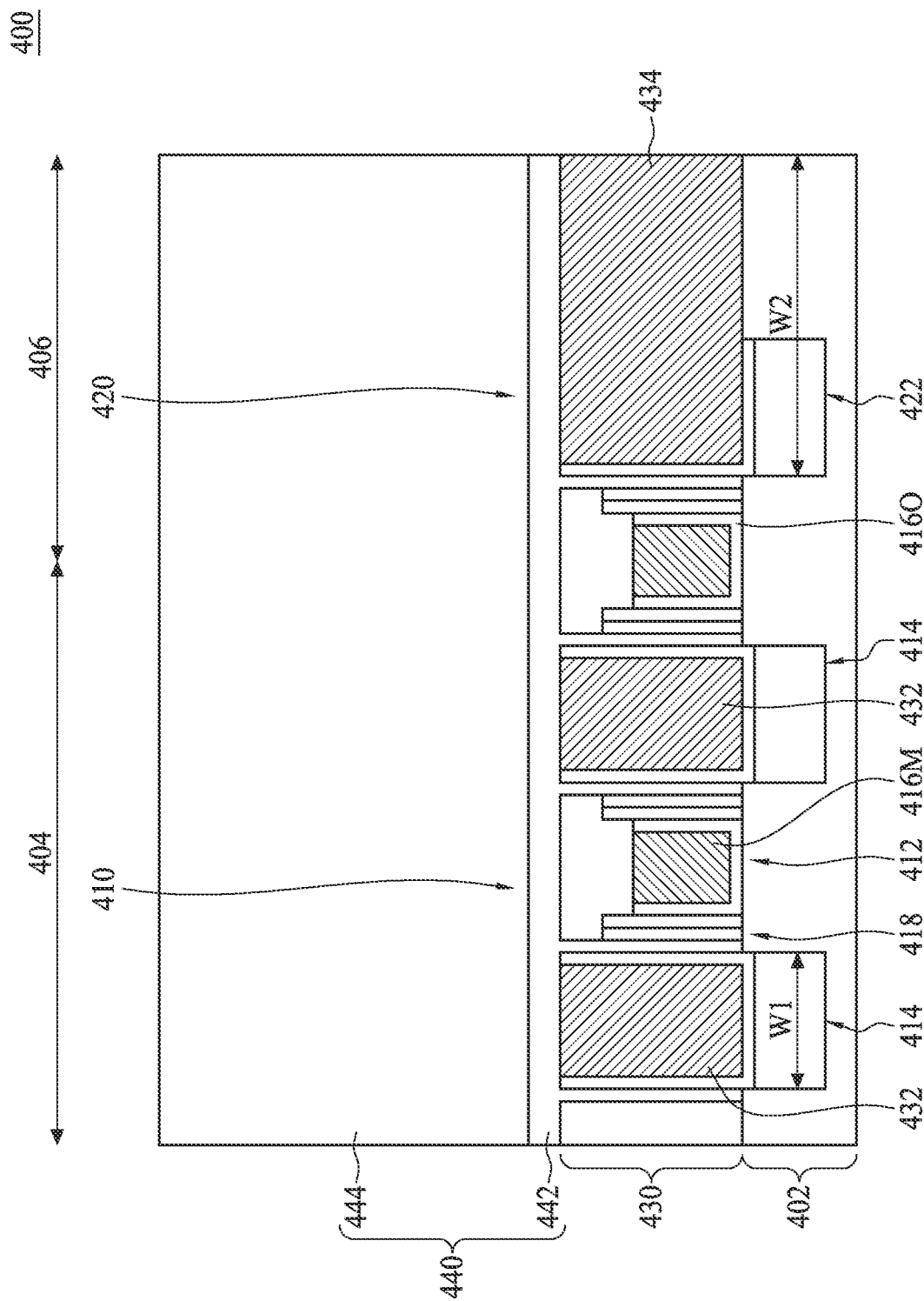

As shown in FIG. 4A, in operation 31, a first device 410 can be disposed in the first region 404 and a second device 420 can be disposed in the second region 406. The first device 410 can include a gate structure 412 and source/drain structures 414 disposed at two sides of the gate structure 412. The second device 420 can include a gate structure (not shown) and source/drain structures 422 at two sides of the gate structure. In some embodiments, the gate structure 412 can be formed over a fin structure while the source/drain structures 414 can be formed in the fin structure. In some embodiments, the gate structure 412 can include a metal gate structure. In some embodiments, the metal gate structure includes a gate dielectric layer 416O and a metal stack 416M including at least a work function metal layer over the gate dielectric layer and a contact metal layer over the work function metal layer. The gate dielectric layer 416O can be disposed over the substrate 402, and the metal stack 416M is disposed on the gate dielectric layer 416O. The gate dielectric layer 416O includes a dielectric material, such as silicon oxide, high-k dielectric material, another suitable dielectric material, or a combination thereof. High-k dielectric material generally refers to dielectric materials having a high dielectric constant, for example, greater than a dielectric constant of silicon oxide ($k \approx 3.9$). Exemplary high-k dielectric materials include hafnium, aluminum, zirconium, lanthanum, tantalum, titanium, yttrium, oxygen, nitrogen, another suitable constituent, and combinations thereof. In some embodiments, the gate dielectric layer includes a multilayer structure, such as an interfacial layer (IL) including, for example, silicon oxide, and a high-k dielectric layer including, for example, $HfO_2$, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, another suitable high-k dielectric material, or a combination thereof.

The work function metal layer of the metal stack 416M includes a conductive material tuned to have a desired work function (such as an n-type work function or a p-type work function), such as an n-type work function material and/or a p-type work function material. P-type work function materials include TiN, TaN, Ru, Mo, Al, WN, $ZrSi_2$, $MoSi_2$, $TaSi_2$, $NiSi_2$, WN, another p-type work function material, or combinations thereof. N-type work function materials include Ti, Al, Ag, Mn, Zr, TiAl, TiAlC, TaC, TaCN, TaSiN, TaAl, TaAlC, TiAlN, another n-type work function material, or combinations thereof. The contact metal layer (also referred to as a gap-filling metal layer) of the metal stack 416M can include a suitable conductive material, such as Al, W, and/or Cu.

The first and second devices 410 and 420 can further include spacers 418, which are disposed adjacent to (for example, along sidewalls of) the gate structure 412. The spacers 418 can be formed by any suitable process and include a dielectric material. The dielectric material can include silicon, oxygen, carbon, nitrogen, another suitable material, or combinations thereof (for example, silicon oxide, silicon nitride, silicon oxynitride, or silicon carbide). In some embodiments, the spacers 418 can include a multilayer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to the gate structure 412.

Implantation, diffusion, and/or annealing processes can be performed to form lightly-doped source and drain (LDD) features and/or heavily-doped source and drain (HDD) features in the substrate 402 before and/or after the forming of the spacers 418.

In some embodiments, the source/drain structures 414 of the first deice 410 and the source/drain structures 422 of the second device 420 can include epitaxial structures EPI. For example, a semiconductor material is epitaxially grown on the substrate 402, forming epitaxial source/drain structures 414 and 422 over a source region and a drain region of the substrate 402. Accordingly, the gate structure 412, the epitaxial source/drain structure 414 and a channel region defined between the epitaxial source/drain structures 414 form the first device 410 such as a transistor. In some embodiments, the epitaxial source/drain structures 414 and 422 can surround source/drain regions of a fin structure. In some embodiments, the epitaxial source/drain structures 414 and 422 can replace portions of the fin structure. The epitaxial source/drain structures 414 and 422 are doped with n-type dopants and/or p-type dopants. In some embodiments, where the transistor is configured as an n-type device (for example, having an n-channel), the epitaxial source/drain structures 414 and 422 can include silicon-containing epitaxial layers or silicon-carbon-containing epitaxial layers doped with phosphorous, another n-type dopant, or combinations thereof (for example, Si:P epitaxial layers or Si:C:P epitaxial layers). In alternative embodiments, where the transistor is configured as a p-type device (for example, having a p-channel), the epitaxial source/drain structures 414 and 422 can include silicon-and-germanium-containing epitaxial layers doped with boron, another p-type dopant, or combinations thereof (for example, Si:Ge:B epitaxial layers). In some embodiments, the epitaxial source/drain structures 414 and 422 include materials and/or dopants that achieve desired tensile stress and/or compressive stress in the channel region. As mentioned above, elements mentioned above can be formed by FEOL processes; therefore, the first device 410 and the second device 420 can be referred to as the FEOL devices 110.

As shown in FIG. 4A, a first interlayer dielectric (ILD) structure 430 can be disposed over the substrate 402. The first ILD structure 430 can include a dielectric material including, for example, silicon oxide, silicon nitride, silicon oxynitride, TEOS formed oxide, PSG, BPSG, low-k dielectric material, another suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, another low-k dielectric material, and combinations thereof. As shown in FIG. 4A, the first ILD structure 430 may cover the first device 410 and the second device 420.

In operation 21 and 31, in some embodiments, a first conductive feature 432 is formed in the first region 404 and a second conductive feature 434 is formed in the second region 406. The first conductive feature 432 and the second conductive feature 434 are formed in the first ILD structure 430 and separated from each other, as shown in FIG. 4A. Further, the first conductive feature 432 is coupled to the first device 410, and the second conductive feature 434 is coupled to the second device 420. In some embodiments, as shown in FIG. 4A, the first conductive feature 432 is coupled to the source/drain structure 414 of the first device 410 while the second conductive feature 434 is coupled to the source/drain structure 422 of the second device 420. In some embodiments, the first conductive feature 432 and the second conductive feature 434 can be referred to as a metal-to-drain (MD) contact, which generally is referred to as a contact to a conductive region of a transistor, such as the source/drain structures 414 and 422, such that the source/drain structures 414 and 422 can be electrically connected to the BEOL interconnection through the conductive features 432 and 434. Accordingly, the FEOL structures 110 can be electrically connected to the BEOL interconnection through the conductive features 432 and 434, which also can be referred to as parts of the MEOL interconnect structures 120.

The first conductive feature 432 has a first width W1 and the second conductive feature 434 has a second width W2. In some embodiments, different regions have different dimension requirements. For example, the second width W2 of the second conductive feature 434 in the second region 406 (i.e., the IO region) is greater than the first width W1 of the first conductive feature 432 in the first region 404 (i.e., the memory array region). For example, the first width W1 of the first conductive feature 432 can be between approximately 15 nanometers and approximately 30 nanometers, while the second width W2 of the second conductive feature 434 can be between approximately 60 nanometers and approximately 300 nanometers, but the disclosure is not limited thereto. The first conductive feature 432 and the second conductive feature 434 can include a same metal material. In some embodiments, the first conductive feature 432 and the second conductive feature 434 can include cobalt (Co), tungsten (W) or ruthenium (Ru), but the disclosure is not limited thereto. Further, the first conductive feature 432 has a first metal grain size, and the second conductive feature 434 has a second metal grain size. In some embodiments, it is found that a metal grain size may be related to the width of the conductive features. For example, the second metal grain size of the second conductive feature 434, which has the second width W2 greater than the first width W1 of the first conductive feature 432, is greater than the first metal grain size of the first conductive feature 432. In some embodiments, the second metal grain size may be two times the first metal grain size, but the disclosure is not limited thereto.

In operation 21 and operation 31, the substrate 402 further includes a dielectric structure 440 over the first device 410, the second device 420, the first conductive feature 432, the second conductive feature 434 and the first ILD structure 430. In some embodiments, the dielectric structure 440 can be referred to as a second ILD structure. In some embodiments, the second ILD structure 440 may include a multi-layered structure that includes a plurality of dielectric layers. For example, the second ILD structure 440 can include a first dielectric layer 442 over the first ILD structure 430 and a second dielectric layer 444 over the first dielectric layer 442. In some embodiments, the second dielectric layer 444 can include materials substantially the same as those of the first ILD structure 430, but the disclosure is not limited thereto. In some embodiments, the material of the first dielectric layer 442 can be different from that of the first ILD structure 430 and the second dielectric layer 444, such that the first dielectric layer 442 may serve as an etch stop layer (ESL) or a contact etch stop layer (CESL), but the disclosure is not limited thereto. Additionally, a thickness of the second dielectric layer 444 can be greater than a thickness of the first dielectric layer 442.

Figure 4B:
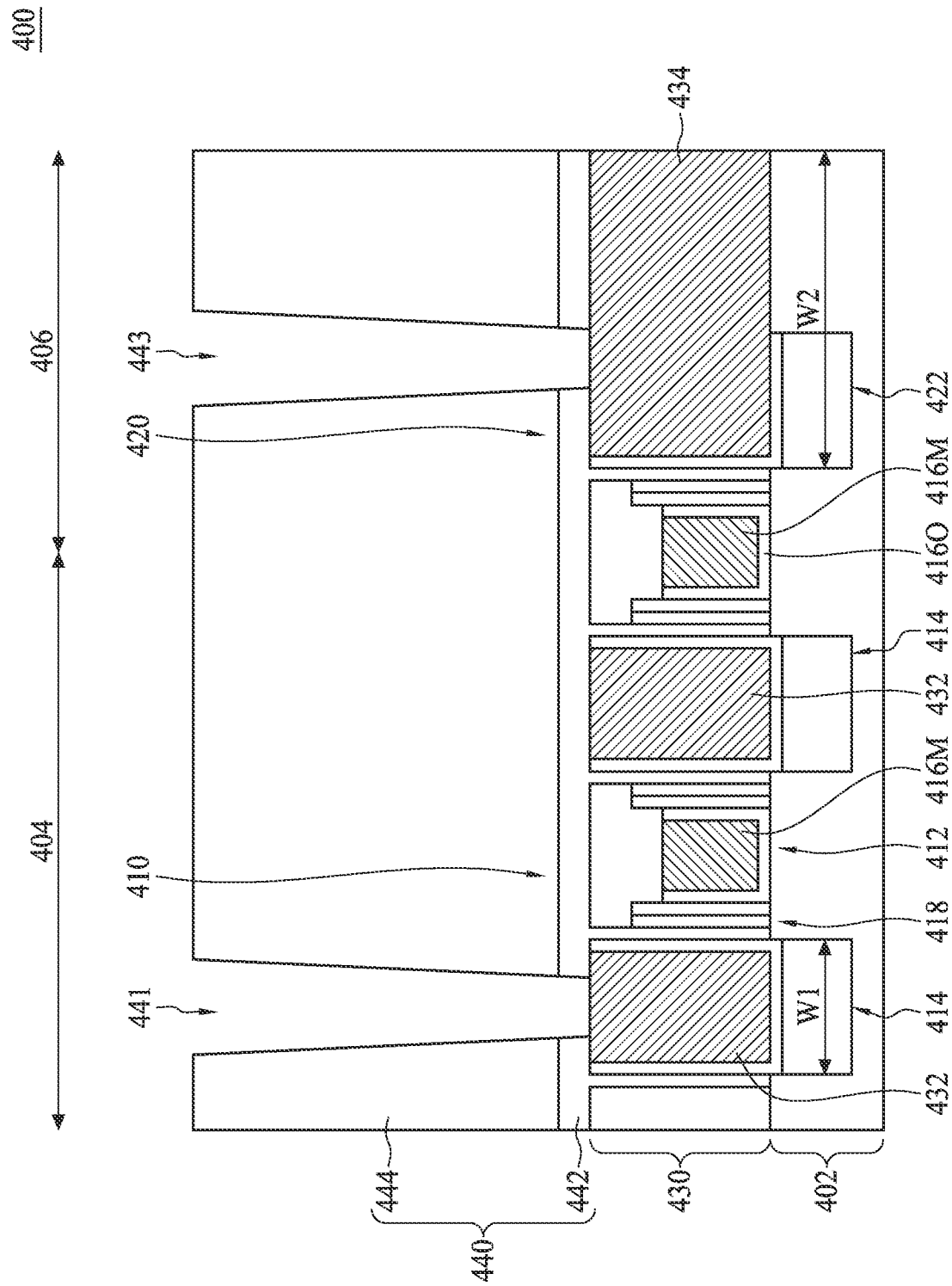

Referring to FIG. 4B, in operation 22, a first opening 441 and a second opening 443 are formed in the second ILD structure 440. In some embodiments, in operation 32, a dry-etching operation is performed to form the first opening 441 and the second opening 443 in the second ILD structure 440. In some embodiments, the dry-etching operation can include using a fluorine-containing (F-containing) plasma, but the disclosure is not limited thereto. Additionally, a typical lithographic operation with masking technologies can be used in operation 22 and operation 32. The dry-etching operation may be performed to remove portions of the second dielectric layer 444 and portions of the first dielectric layer 442, such that, as shown in FIG. 4B, the first opening 441 exposes a portion of the first conductive feature 432 and the second opening 443 exposes a portion of the second conductive feature 434. In other words, the first conductive feature 432 is exposed through a bottom of the first opening 441, and the second conductive feature 434 is exposed through a bottom of the second opening 443. In some embodiments, a width of the first opening 441 and a width of the second opening 443 can be substantially the same, but the disclosure is not limited thereto. In some embodiments, a depth of the first opening 441 and a depth of the second opening 443 are substantially the same, but the disclosure is not limited thereto. In some embodiments, the width of the first opening 441 and the width of the second opening 443 can be less than the first width W1 of the first conductive feature 432 and less than the second width of the second conductive feature 434. For example, the width of the first opening 441 and the width of the second opening 443 can be between approximately 10 nanometers and approximately 100 nanometers, but the disclosure is not limited thereto.

It should be noted that when the portions of the first and second conductive features 432 and 434 are exposed through the bottoms of the first and the second openings 441 and 443 in the dry-etching operation using the F-containing plasma, fluorine ions may react with the metal material of the exposed portions of the first and second conductive features 432 and 434 to form metal fluoride. The metal fluoride may be removed after the performing of the dry-etching operation and thus metal consumption is caused. Further, the metal consumption may form recesses respectively in the first and second conductive features 432 and 434, though not shown. It is found that such metal consumption may be related to the metal grain size. When a conductive feature has a smaller metal grain size, a wider and deeper recess may be formed in that conductive feature. In some comparative approaches, a recess may be formed in the first conductive feature 432 and a recess may be formed in the second conductive feature 434. It is found that when the second metal grain size of the second conductive feature 434 is two times the first metal grain size of the first conductive feature 432, the recess in the first conductive feature 432 has a width and a depth that are greater than those of the recess in the second conductive feature 434. In some embodiments, a depth difference ratio between a depth of the recess in the first conductive feature 432 and a depth of the recess in the second conductive feature 434 may be greater than 40%. In such comparative approaches, the recesses with depth uniformity issue may cause difficulty in subsequent operations.

Figure 4C:
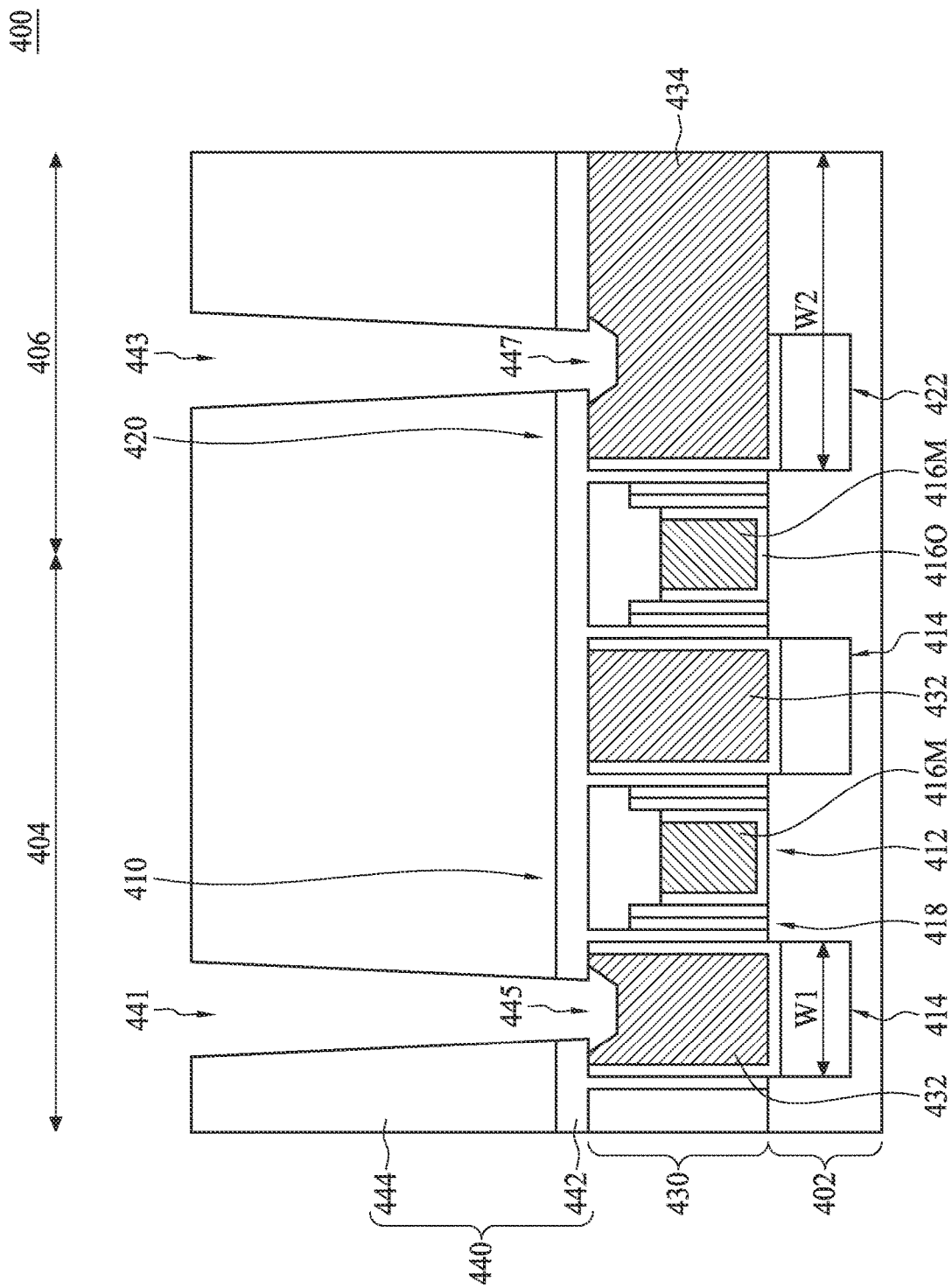

Referring to FIG. 4C, in operation 23, an etchant is used to remove a portion of the first conductive feature 432 to form a first recess 445 in the first conductive feature 432, and to remove a portion of the second conductive feature 434 to form a second recess 447 in the second conductive feature 434. In some embodiments, in operation 33, a wet-etching operation is performed to form the first recess 445 at the bottom of the first opening 441 and the second recess 447 at the bottom of the second opening 443. As shown in FIG. 4C, the first recess 445 is coupled to the first opening 441, and the second recess 447 is coupled to the second opening 443.

In some embodiments, an etchant used in the wet-etching operation includes ozone ($O_3$), ammonium hydroxide-hydrogen peroxide mixture (APM), ammonium hydroxide/ozone/DI water mixture (AOM), organic oxidizer, or a combination thereof.

For example, an etchant including $O_3$ and APM can be used in the wet etching operation. In such embodiments, a concentration of the $O_3$ in the etchant can be between approximately 1% and approximately 10%, and a concentration of the APM can be between approximately 1% and approximately 50%, but the disclosure is not limited thereto. In some embodiments, the etchant including $O_3$ and APM can further include an organic oxidizer. In such embodiments, a concentration of the organic oxidizer can be between approximately 1% and approximately 50%, but the disclosure is not limited thereto.

In other embodiments, the etchant used in the wet etching operation can include AOM, and a concentration of AOM can be between approximately 1% and approximately 10%, but the disclosure is not limited thereto. In such embodiments, the etchant including AOM can further include an organic oxidizer. In other embodiments, the etchant used in the wet etching operation can include AOM and $O_3$, such embodiments, a concentration of the $O_3$ in the etchant can be between approximately 1% and approximately 10%, and a concentration of the AOM can be between approximately 1% and approximately 10%, but the disclosure is not limited thereto. In such embodiments, the etchant including AOM and $O_3$ can further include an organic oxidizer.

In some embodiments, the wet etching operation can be performed at a temperature between approximately 23° C. and approximately 70° C., but the disclosure is not limited thereto. In some embodiments, the wet etching operation can be performed for a duration between approximately 1 minute and approximately 10 minutes, but the disclosure is not limited thereto.

In some embodiments, a depth of the first recess 445 and a depth of the second recess 447 are respectively between approximately 8 nanometers and approximately 12 nanometers, but the disclosure is not limited thereto. It should be noted that the compounds or mixtures used in the etchant are strong oxidants. Therefore, the metal materials of the first and second conductive features 432 and 434 may react with the oxidant to form metal oxide, which can be easily removed. Further, the reactions between the metal materials and the oxidant are unrelated to the metal grain size. Consequently, in some embodiments, a depth difference ratio between the depth of the first recess 445 and the depth of the second recess 447 can be less than approximately 10%. In other embodiments, the depth difference ratio between the depth of the first recess 445 and the depth of the second recess 447 can be less than approximately 8%. Additionally, a depth of the first opening 441 is greater than the depth of the first recess 445, and a depth of the second opening 443 is greater than the depth of the second recess 447, as shown in FIG. 4C.

Figure 4D:
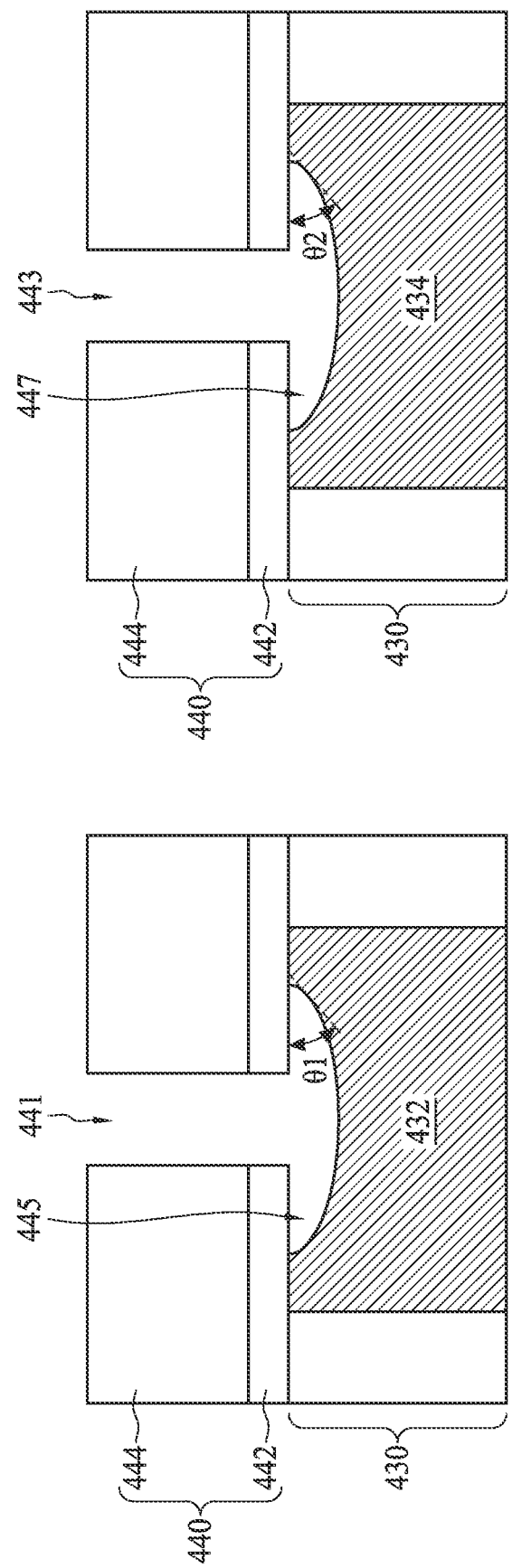

Referring to FIG. 4D, which is a partial enlarged view of the first recess 445 and the second recess 447, in some embodiments, a widest portion of the first recess 445 has a width greater than a width of the first opening 441, and a widest portion of the second recess 447 has a width greater than the width of the second opening 443. In some embodiments, the first conductive feature 432 is exposed through sidewalls and a bottom of the first recess 445, and the second conductive feature 434 is exposed through sidewalls and a bottom of the second recess 447. In some embodiments, the first recess 445 and the second recess 447 can include slanted sidewalls, as shown in FIG. 4C. An included angle θ1 may be formed between the slanted sidewall of the first recess 445 and the first dielectric layer 442, and an included angle θ2 may be formed between the slanted sidewall of the second recess 447 and the first dielectric layer 442. In some embodiments, the included angle θ1 can be between approximately 40° and approximately 60°, and the included angle θ2 can be between approximately 40° and approximately 60°, but the disclosure is not limited thereto. In some embodiments, the included angle θ1 and the included angle θ2 may be the same. In some alternative embodiments, the included angle θ1 and the included angle θ2 are different.

Figure 4E:
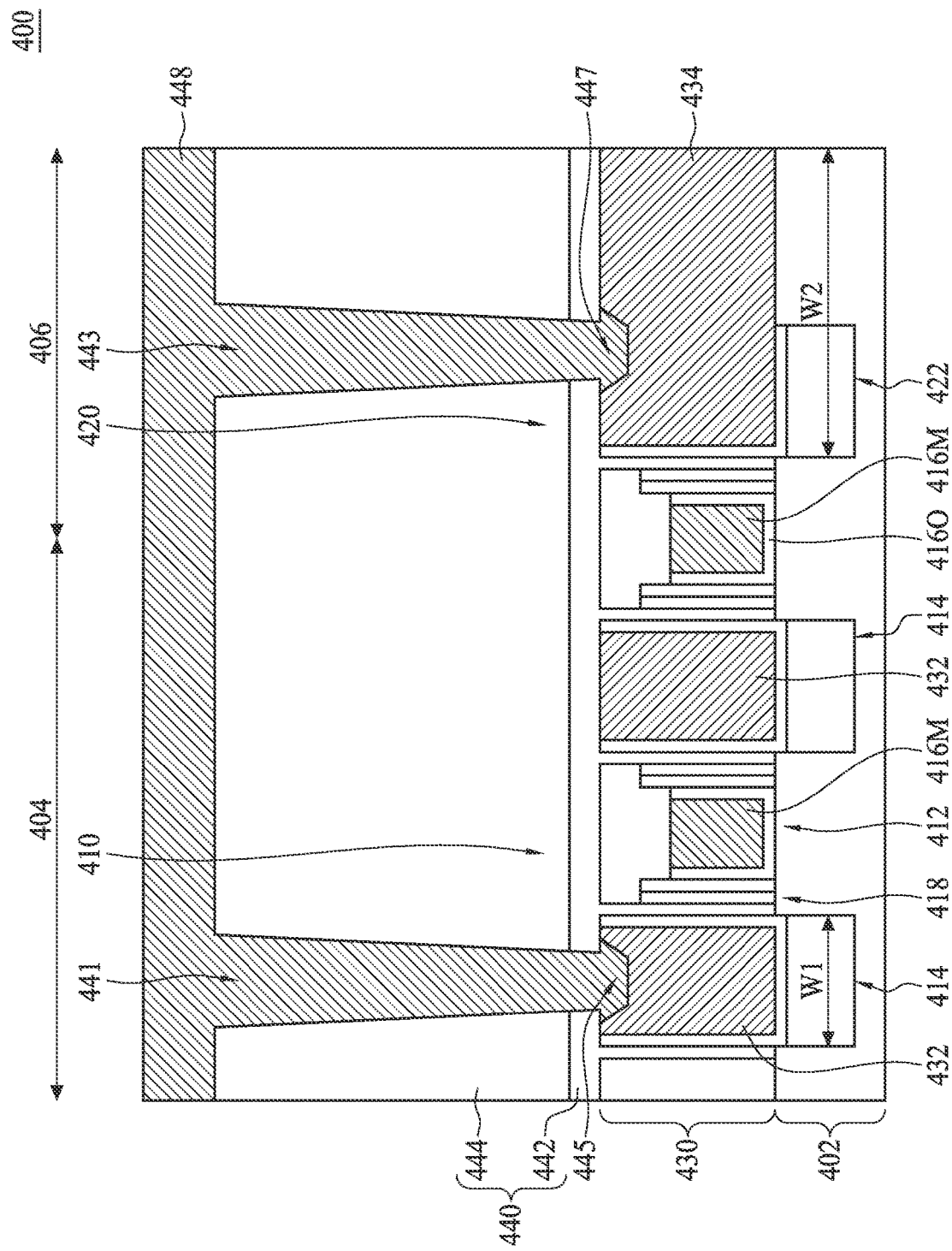

Referring to FIG. 4E, in operation 34, the first recess 445, the second recess 447, the first opening 441 and the second opening 443 are filled with a conductive material 448. In some embodiments, the conductive material can include copper (Cu), tungsten (W), ruthenium (Ru) and cobalt (Co). In some embodiment, the conductive material is different from the material of the first conductive feature 432 and the second conductive feature 434.

Figure 4F:
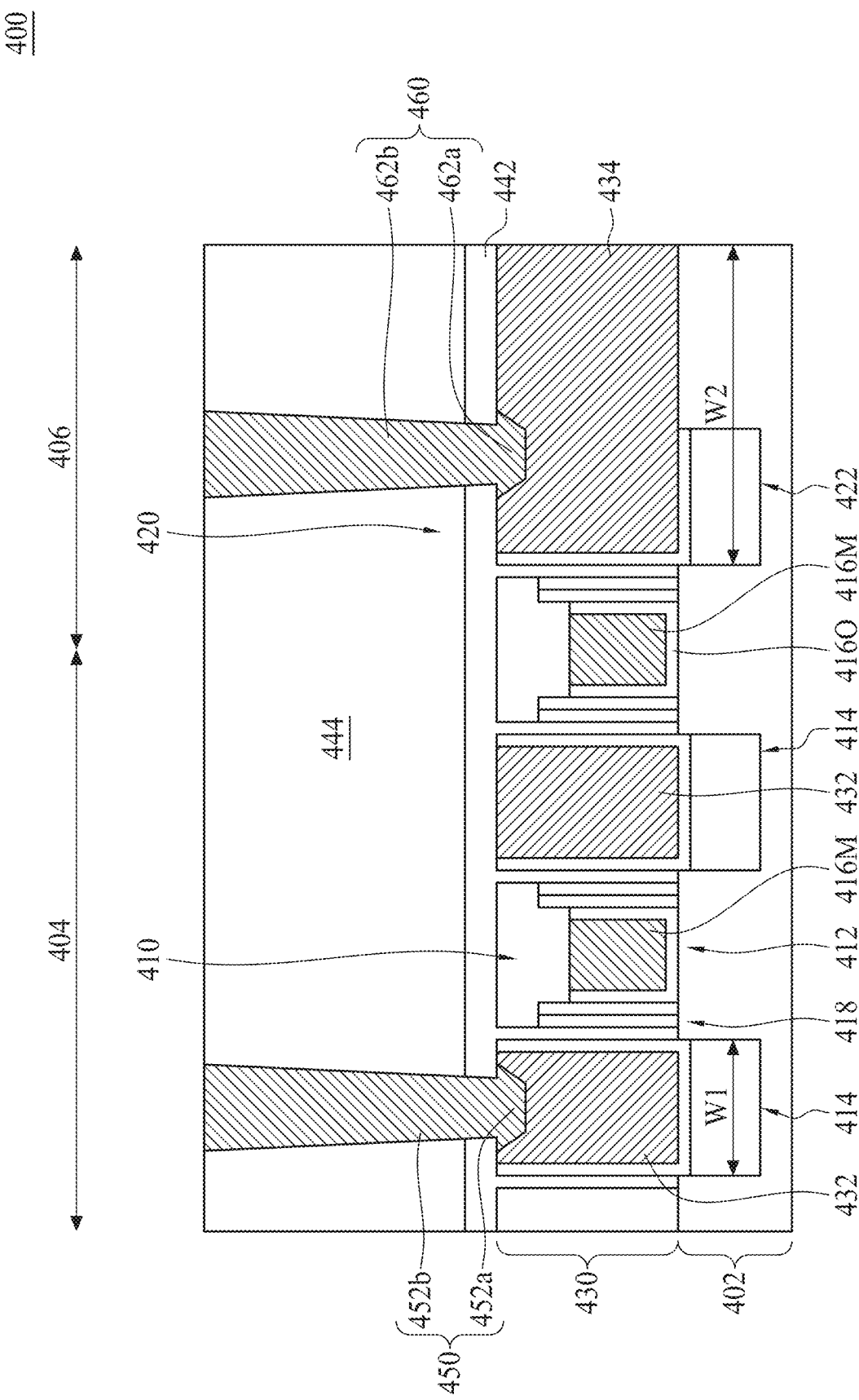

As shown in FIG. 4F, a planarization operation, such as a chemical-mechanical planarization (CMP) operation, may be performed to remove superfluous conductive material and a portion of the second ILD structure 440. Accordingly, in operation 24, a third conductive feature 450 is formed in the first opening 441 and the first recess 445, and a fourth conductive feature 460 is formed in the second opening 443 and the second recess 447. In some embodiments, CMP is carried out by placing the substrate 402 in a wafer carrier that presses the wafer surface to be polished against a polishing pad attached to a platen. The platen and the wafer carrier are counter-rotated while an abrasive slurry containing both abrasive particles and reactive chemicals is applied to the polishing pad. The slurry is transported to the wafer surface via the rotation of the polishing pad. The relative movement of the polishing pad and the wafer surface coupled with the reactive chemicals in the abrasive slurry allows CMP to level the wafer surface by means of both physical and chemical actions. In some embodiments, a slurry that is reactive to the second dielectric layer 444 and the conductive material is chosen. However, it is found that slurry may seep along an interface between the metal material and the second dielectric layer 444. In some comparative approaches, the slurry may consume the first and second conductive features 432 and 434 once it contacts the first and second conductive features 432 and 434. In some comparative approaches, portions of the first and second conductive features 432 and 434 may be removed and cause metal loss issue. In such comparative approaches, to mitigate this metal loss issue, the slurry used in the CMP has a requirement: it has to react with the metal material used to form the third and fourth conductive features 450 and 460 but also be non-reactive with the metal material used to form the first and second conductive features 432 and 434. Consequently, the planarization suffers from a narrow choice issue for the slurry.

To mitigate the metal loss issue and the narrow choice issue, the first recess 445 and the second recess 447 are provided. As shown in FIG. 4F, in some embodiments, the slurry may seep downwardly along the interface between the conductive material 448 and the second dielectric layer 444. However, the slurry may be blocked from the first and second conductive features 432 and 434 by the conductive material in the first recess 445 and the second recess 447. Therefore, the metal loss issue can be mitigated. Further, because the slurry may be blocked from the first and second conductive features 432 and 434, the feature of non-reactivity of metal material used to form the first and second conductive features 432 and 434 is no longer required, and thus the narrow choice issue is mitigated.

Accordingly, a connecting structure is 400 is obtained as shown in FIG. 4F. The connecting structure 400 includes the substrate 402 including the first region 404 and the second region 406, the first conductive feature 432 in the first region 404, the second conductive feature 434 in the second region 406, the third conductive feature 450 over and coupled to the first conductive feature 432, and the fourth conductive feature 460 over and coupled to the second conductive feature 434. As mentioned above, the connecting structure 400 may include the first device 410 in the first region 404 and the second device 420 in the second region 406. The details of the first device 410 and the second device 420 may be similar to those described above; therefore, such details are omitted herein in the interest of brevity. As shown in FIG. 4F, the first conductive feature 432 has the first width W1, and the second conductive feature 434 has the second width W2. In some embodiments, the second width W2 is greater than the first width W1. The first conductive feature 432 has the first metal grain size, and the second conductive feature 434 has the second metal grain size. As mentioned above, the metal grain size is related to the width of the first and second conductive features 432 and 434. For example, the second metal grain size of the second conductive feature 434, which has the second width W2 greater than the first width W1 of the first conductive feature 432, is greater than the first metal grain size of the first conductive feature 432. In some embodiments, the second metal grain size may be two times the first metal grain size, but the disclosure is not limited thereto. The first conductive feature 432 and the second conductive feature 434 include a same metal material. The third conductive feature 450 and the fourth conductive feature 460 include a same metal material. However, the metal material of the third and fourth conductive features 450 and 460 is different from that of the first and second conductive features 432 and 434.

In some embodiments, the third conductive feature 450 includes a first anchor portion 452a and a first vertical portion 452b over and coupled to the first anchor portion 452a. In some embodiments, a widest part of the first anchor portion 452a has a width greater than a width of the first vertical portion 452b. A depth of the first vertical portion 452b is greater than a depth of the first anchor portion 452a. In some embodiments, the fourth conductive feature 460 includes a second anchor portion 462a and a second vertical portion 462b over and coupled to the second anchor portion 462a. In some embodiments, a widest part of the second anchor portion 462a has a width greater than a width of the second vertical portion 462b. A depth of the second vertical portion 462b is greater than a depth of the second anchor portion 462a. A depth difference ratio between a depth of the first anchor portion 452a and a depth of the second anchor portion 462a is less than approximately 10%.

Figure 4G:
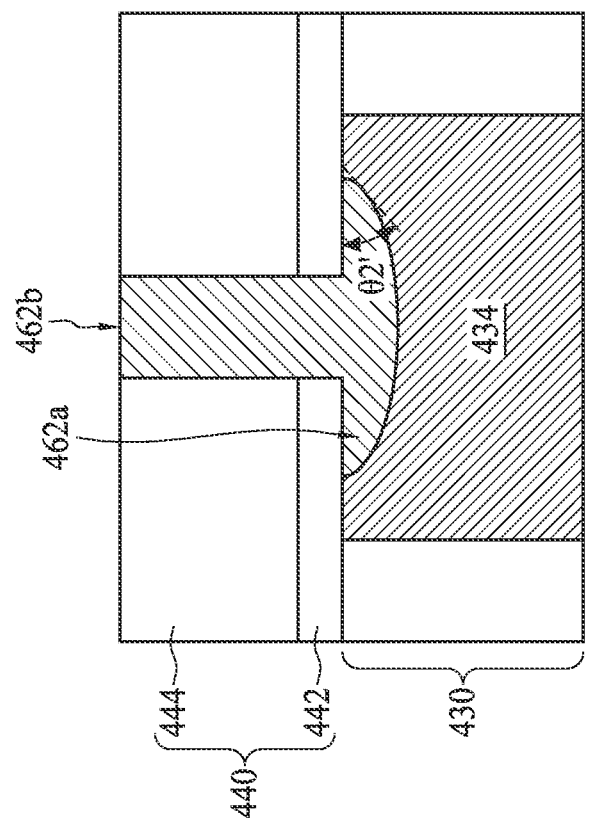
Figure 4G:
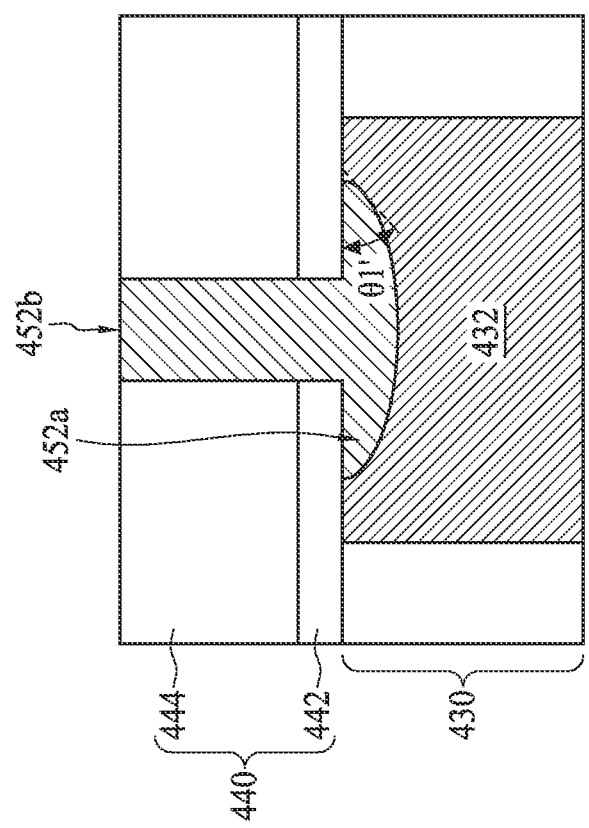

FIG. 4G is a partial enlarged view of the third conductive feature 450 and the fourth conductive feature 460. In some embodiments, an included angle θ1' is formed by a sidewall of the first anchor portion 452a and the first dielectric layer 442, and an included angle θ2' is formed by a sidewall of the second anchor portion 462a and the first dielectric layer 442. In some embodiments, the included angle θ1' can be between approximately 40° and approximately 60°, and the included angle θ2' can be between approximately 40° and approximately 60°, but the disclosure is not limited thereto. In some embodiments, the included angle θ1' and the included angle θ2' may be the same. In some alternative embodiments, the included angle θ1' and the included angle θ2' are different.

Figure 5:
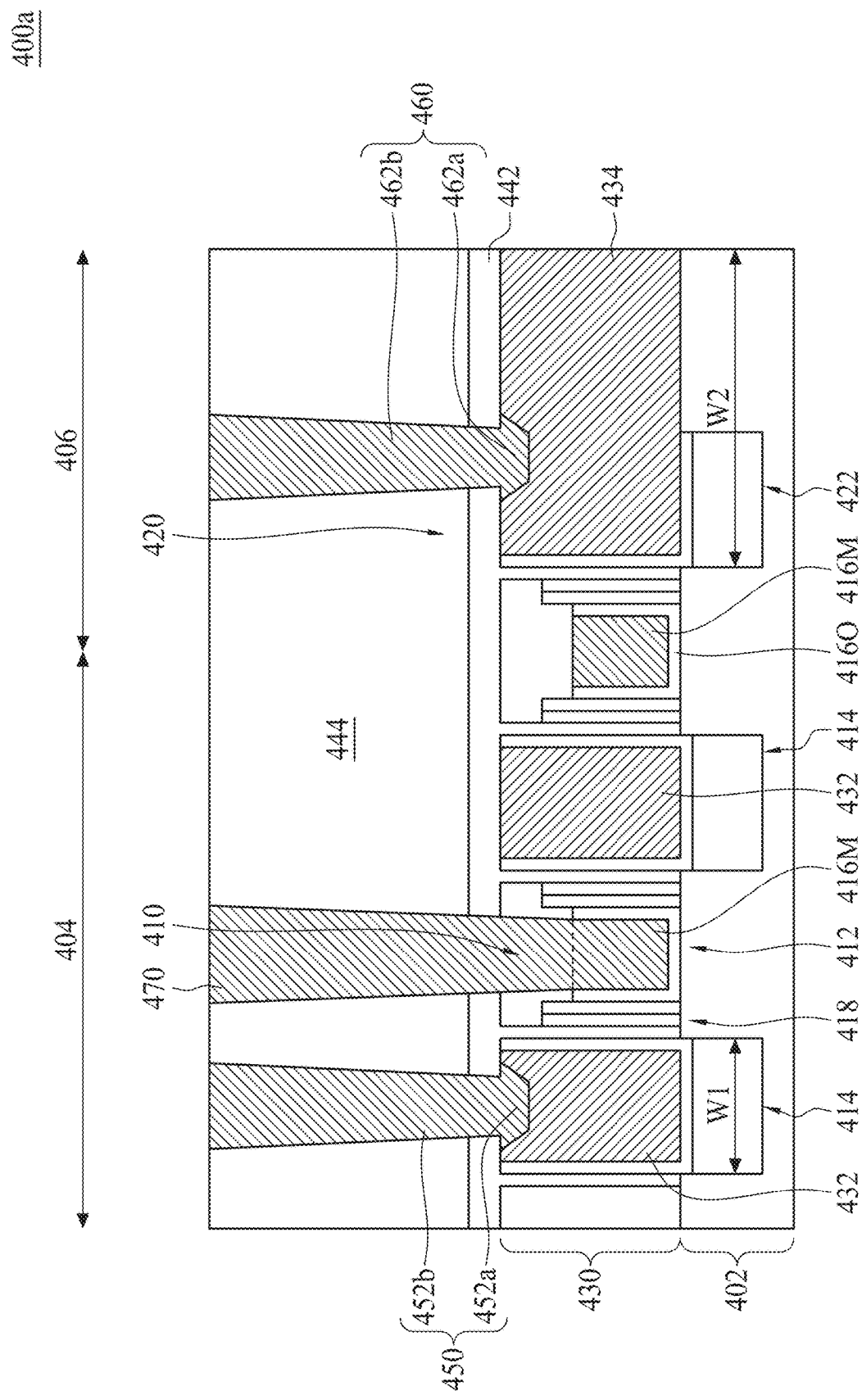
FIG. 5 is a schematic drawing illustrating a connecting structure according to aspects of one or more embodiments of the present disclosure.

FIG. 5 is a schematic drawing illustrating a connecting structure 400a. It should be noted that same elements in FIGS. 4A to 4G and 5 are indicated by the same numerals, and details of the same elements shown in FIGS. 4A to 4G and 5 are omitted in the description of FIG. 5. As mentioned above, in some embodiments, at least the first device 410 can include a metal gate structure. The metal gate structure can include at least a work function metal layer (not shown) and a contact metal layer 416M. In some embodiments, the connecting structure 400a further includes a fifth conductive feature 470 disposed over and coupled to the metal gate structure. For example, the fifth conductive feature 470 can be coupled to the contact metal layer 416M of the metal gate structure. In some embodiments, the fifth conductive feature 470 can include a metal material the same as that of the third conductive feature 450 and the fourth conductive feature 460. Further, the fifth conductive feature 470 can include a metal material the same as that of the contact metal layer 416M of the metal gate structure. In some embodiments, the first conductive feature 432 and the second conductive feature 434 include a same first metal material, while the contact metal layer 416M of the metal gate structure, the third conductive feature 450, the fourth conductive feature 460 and the fifth conductive feature 470 include a same second metal material. Further, the second metal material is different from the first metal material.

In summary, the present disclosure provides a method for forming a connecting structure that uses a wet-etching operation to remove portions of the conductive features. A removal rate of the wet-etching operation is un-related to a metal grain size of the conductive features, while the metal grain size is related to widths of the conductive features. In some embodiments, an etchant used in the wet-etching operation is a strong oxidizer, which can react with the metal materials. Further, the reactions between the metal materials and the oxidant are unrelated to the metal grain size. Consequently, recesses having a depth difference ratio of less than approximately 10% can be obtained. In contrast to the comparative approaches, which have depth difference ratios greater than 40%, the recess uniformity can be improved by the wet-etching operation. Further, the recesses can be filled with the conductive material to form anchor portions of conductive features, which help to mitigate the bottom metal issue during CMP.

In some embodiments, a connecting structure is provided. The connecting structure includes a substrate, a first conductive feature, a second conductive feature, a third conductive feature, and a fourth conductive feature. The substrate includes a first region and a second region. The first conductive feature is in the first region, and includes a first width. The second conductive feature is in the second region, and includes a second width greater than the first width. The third conductive feature is over the first conductive feature, and the fourth conductive feature is over the second conductive feature. The third conductive feature includes a first anchor portion coupled to the first conductive feature, and the fourth conductive feature includes a second anchor portion coupled to the second conductive feature. A depth difference ratio between a depth of the first anchor portion and a depth of the second anchor portion is less than approximately 10%.

In some embodiments, a connecting structure is provided. The connecting structure includes a first conductive feature, a second conductive feature, a third conductive feature over the first conductive feature, and a fourth conductive feature over the second conductive feature. The first conductive feature has a first metal grain size. The second conductive feature has a second metal grain size greater than the first metal grain size. The third conductive feature includes a first anchor portion and a first vertical portion. The fourth conductive feature includes a second anchor portion and a second vertical portion. A width of the first anchor portion is greater than a width of the first vertical portion, and a width of the second anchor portion is greater than a width of the second vertical portion.

In some embodiments, a semiconductor structure is provided. The semiconductor structure includes a first device, a second device, a first conductive feature coupled to the first device, a second conductive feature coupled to the second device, a first conductive anchor coupled to the first conductive feature, and a second conductive anchor coupled to the second conductive feature. The first conductive feature includes a first metal grain size, and the second conductive feature has a second metal grain size greater than the first metal grain size. A top surface of the first conductive anchor, a top surface of the first conductive feature, a top surface of the second conductive anchor and a top surface of the second conductive feature are aligned with each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A connecting structure, comprising:
a substrate comprising a first region and a second region;
a first device disposed in the first region and a second device disposed in the second region, wherein the first device comprises a metal gate structure and a first source/drain structure, and the second device comprises a second source/drain structure, wherein the metal gate structure comprises a contact metal layer;
a first dielectric structure over the substrate;
a first conductive feature in the first dielectric structure in the first region, wherein a bottom of the first conductive feature has a first width;
a second conductive feature in the first dielectric structure in the second region, wherein a bottom of the second conductive feature has a second width greater than the first width of the first conductive feature;
a second dielectric structure over the first dielectric structure;
a third conductive feature in the second dielectric structure and over the first conductive feature, wherein the third conductive feature comprises a first anchor portion coupled to the first conductive feature;
a fourth conductive feature in the second dielectric structure and over the second conductive feature, wherein the fourth conductive feature comprises a second anchor portion coupled to the second conductive feature; and
a fifth conductive feature coupled to the metal gate structure of the first device,
wherein the fifth conductive feature and the contact metal layer of the metal gate structure of the first device comprise a same material,
wherein the first conductive feature and the second conductive feature comprise a metal material different from that of the fifth conductive feature and the contact metal layer,
wherein a depth difference ratio between a depth of the first anchor portion and a depth of the second anchor portion is less than approximately 10%,
wherein a maximum height of the first dielectric structure is less than a height of the second dielectric structure,
wherein the second width of the bottom of the second conductive feature is greater than a width of the second source/drain structure.

2. The connecting structure of claim 1, wherein the first conductive feature and the second conductive feature comprise a same metal material, and the third conductive feature and the fourth conductive feature comprise a same metal material.

3. The connecting structure of claim 2, wherein the first conductive feature has a first metal grain size, the second conductive feature has a second metal grain size, and the second metal grain size is greater than the first metal grain size.

4. The connecting structure of claim 1, wherein the first conductive feature and the third conductive feature comprises different materials, and the second conductive feature and the fourth conductive feature comprise different materials.

5. The connecting structure of claim 1, wherein the third conductive feature further comprises a first vertical portion over and coupled to the first anchor portion, and the fourth conductive feature further comprises a second vertical portion over and coupled to the second anchor portion.

6. The connecting structure of claim 5, wherein a width of the first anchor portion is greater than a width of the first vertical portion, and a width of the second anchor portion is greater than a width of the second vertical portion.

7. The connecting structure of claim 1, wherein the first conductive feature is coupled to the first device, and the second conducive feature is coupled to the second device.

8. The connecting structure of claim 1, wherein the first conductive feature is coupled to the first source/drain structure, and the second conductive feature is coupled to the second source/drain structure.

9. The connecting structure of claim 1, wherein the contact metal layer, the third conductive feature and the fourth conductive feature comprise a same material.

10. A connecting structure, comprising:
a metal gate structure comprising a contact metal layer;
a first dielectric structure;
a first conductive feature having a first metal grain size in the first dielectric structure;
a second conductive feature having a second metal grain size greater than the first metal grain size in the first dielectric structure;
a second dielectric structure over the first dielectric structure;
a dielectric layer between the first dielectric structure and the second dielectric structure;
a third conductive feature in the second dielectric structure and over the first conductive feature, wherein the third conductive feature comprises a first anchor portion and a first vertical portion;
a fourth conductive feature in the second dielectric structure and over the second conductive feature, wherein the fourth conductive feature comprises a second anchor portion and a second vertical portion; and
a fifth conductive feature in the first dielectric structure, the second dielectric structure and the dielectric layer, wherein the fifth conductive feature and the contact metal layer of the metal gate structure comprise a same material,
wherein the first conductive feature and the second conductive feature comprise a metal material different from that of the fifth conductive feature and the contact metal layer,
wherein a width of the first anchor portion is greater than a width of the first vertical portion, and a width of the second anchor portion is greater than a width of the second vertical portion,
wherein a maximum height of the first dielectric structure is less than a height of the second dielectric structure,
wherein a top surface of the first anchor portion and a top surface of the second anchor portion are lower than a top surface of the dielectric layer.

11. The connecting structure of claim 10, wherein a thickness of the dielectric layer is less than the maximum height of the first dielectric structure, and less than a height of the second dielectric structure.

12. The connecting structure of claim 10, wherein the dielectric layer comprises a material different from that of the first dielectric structure and different from that of the second dielectric structure.

13. The connecting structure of claim 10, further comprising a first device and a second device, wherein the first conductive feature is coupled to the first device, and the second conducive feature is coupled to the second device.

14. The connecting structure of claim 13, wherein the first device comprises a first source/drain structure, the second device comprise a second source/drain structure, the first conductive feature is coupled to the first source/drain structure, and the second conductive feature is coupled to the second source/drain structure.

15. The connecting structure of claim 13, wherein the contact metal layer, the third conductive feature and the fourth conductive feature comprise a same material.

16. A semiconductor structure comprising:
a first device and a second device, wherein the first device comprises a metal gate structure, and the metal gate structure comprises a contact metal layer;
a first dielectric structure;
a first conductive feature disposed in the first dielectric structure and coupled to the first device and comprising a first metal grain size;
a second conductive feature disposed in the first dielectric structure and coupled to the second device and comprising a second metal grain size greater than the first metal grain size;
a first conductive anchor coupled to the first conductive feature;
a second conductive anchor coupled to the second conductive feature,
a second dielectric structure over the first dielectric structure, the first conductive feature, the second conductive feature, the first conductive anchor and the second conductive anchor;
a dielectric layer between the first dielectric structure and the second dielectric structure; and
a third conductive feature coupled to the metal gate structure of the first device, wherein the third conductive feature and the contact metal layer of the metal gate structure of the first device comprise a same material,
wherein the first conductive feature and the second conductive feature comprise a metal material different from that of the third conductive feature and the contact metal layer,
wherein a top surface of the first conductive anchor, a top surface of the first conductive feature, a top surface of the second conductive anchor and a top surface of the second conductive feature are aligned with each other,
wherein the top surface of the first conductive anchor and the top surface of the second conductive anchor are lower than a top surface of the dielectric layer,
wherein a height of the first dielectric structure is less than a height of the second dielectric structure.

17. The semiconductor structure of claim 16, wherein a height of the first conductive feature and a height of the second conductive feature are substantially equal to the height of the first dielectric structure.

18. The semiconductor structure of claim 16, further comprising:
a first conductive pillar disposed in the second dielectric structure and coupled to the first conductive anchor; and
a second conductive pillar disposed in the second dielectric structure and coupled to the second conductive anchor.

19. The connecting structure of claim 18, wherein the first conductive pillar and the second conductive pillar comprise a metal material same as that of the third conductive feature.

20. The connecting structure of claim 16, wherein the first conductive anchor and the second conductive anchor comprise a metal material same as that of the third conductive feature.

* * * * *